US010784889B2

(12) United States Patent
Duesterberg et al.

(10) Patent No.: US 10,784,889 B2
(45) Date of Patent: Sep. 22, 2020

(54) ELECTRIC CONTROL DEVICE

(71) Applicant: Lenze Automation GmbH, Aerzen (DE)

(72) Inventors: Dirk Duesterberg, Emmerthal (DE); Daniel Borowski, Scherzingen (CH); Andreas Burgermeister, Mauren (CH)

(73) Assignee: Lenze Automation GmbH, Aerzen (DE)

( * ) Notice: Subject to any disclaimer, the term of this patent is extended or adjusted under 35 U.S.C. 154(b) by 0 days.

(21) Appl. No.: 16/629,796

(22) PCT Filed: Jul. 9, 2018

(86) PCT No.: PCT/EP2018/068495
§ 371 (c)(1),
(2) Date: Jan. 9, 2020

(87) PCT Pub. No.: WO2019/011835
PCT Pub. Date: Jan. 17, 2019

(65) Prior Publication Data
US 2020/0177198 A1    Jun. 4, 2020

(30) Foreign Application Priority Data
Jul. 10, 2017  (DE) ................... 10 2017 211 771

(51) Int. Cl.
*H03M 3/00* (2006.01)
*G08C 19/26* (2006.01)
(Continued)

(52) U.S. Cl.
CPC ............ *H03M 3/376* (2013.01); *G08C 19/26* (2013.01); *H03M 3/458* (2013.01); *H02M 3/157* (2013.01);
(Continued)

(58) Field of Classification Search
CPC .......... H03M 3/30; H03M 1/001; H03M 1/12; H03M 5/02; H02M 3/157
(Continued)

(56) References Cited

U.S. PATENT DOCUMENTS 5,841,386 A * 11/1998 Leduc ................... H03M 3/504
                                                               341/143
2010/0331039 A1   12/2010 Hezar
2011/0128175 A1    6/2011 Harris et al.

FOREIGN PATENT DOCUMENTS

CN           104980156 A      10/2015

OTHER PUBLICATIONS

International Search Report (PCT/ISA/210) issued in PCT Application No. PCT/EP2018/068495 dated Oct. 4, 2018 with English translation (six (6) pages).
(Continued)

*Primary Examiner* — Joseph J Lauture
(74) *Attorney, Agent, or Firm* — Crowell & Moring LLP

(57) ABSTRACT

An electric control device includes a first delta sigma modulator having a clock input connection, a second delta sigma modulator having a clock input connection, and an evaluation unit. The evaluation unit includes a first clock output connection which is connected to the clock input connection of the first delta sigma modulator by a first electrical cable, and a second clock output connection which is connected to the clock input connection of the second delta sigma modulator by a second electrical cable. The evaluation unit is designed to generate a clock signal (CLK1) at the first clock output connection (7) in phase opposition to a clock signal (CLK2) at the second clock output connection (9).

7 Claims, 1 Drawing Sheet

(51) Int. Cl.
    *H03M 1/00*     (2006.01)
    *H03M 5/02*     (2006.01)
    *H03M 1/12*     (2006.01)
    *H02M 3/157*    (2006.01)

(52) U.S. Cl.
    CPC .............. *H03M 1/001* (2013.01); *H03M 1/12*
        (2013.01); *H03M 3/30* (2013.01); *H03M 5/02*
        (2013.01)

(58) Field of Classification Search
    USPC .......... 341/143, 110, 155; 323/283; 375/340
    See application file for complete search history.

(56) References Cited

OTHER PUBLICATIONS

German-language Written Opinion (PCT/ISA/237) issued in PCT Application No. PCT/EP2018/068495 dated Oct. 4, 2018 (eight (8) pages).

Anonymous, "AD9525—Low Jitter Clock Generator with Eight LVPECL Outputs," Apr. 2, 2013, pp. 1-48, Retrieved from the Internet: http://analog.com/media/en/technical-documentation/data-sheets/AD9525.pdf, XP055509738 (48 pages).

\* cited by examiner

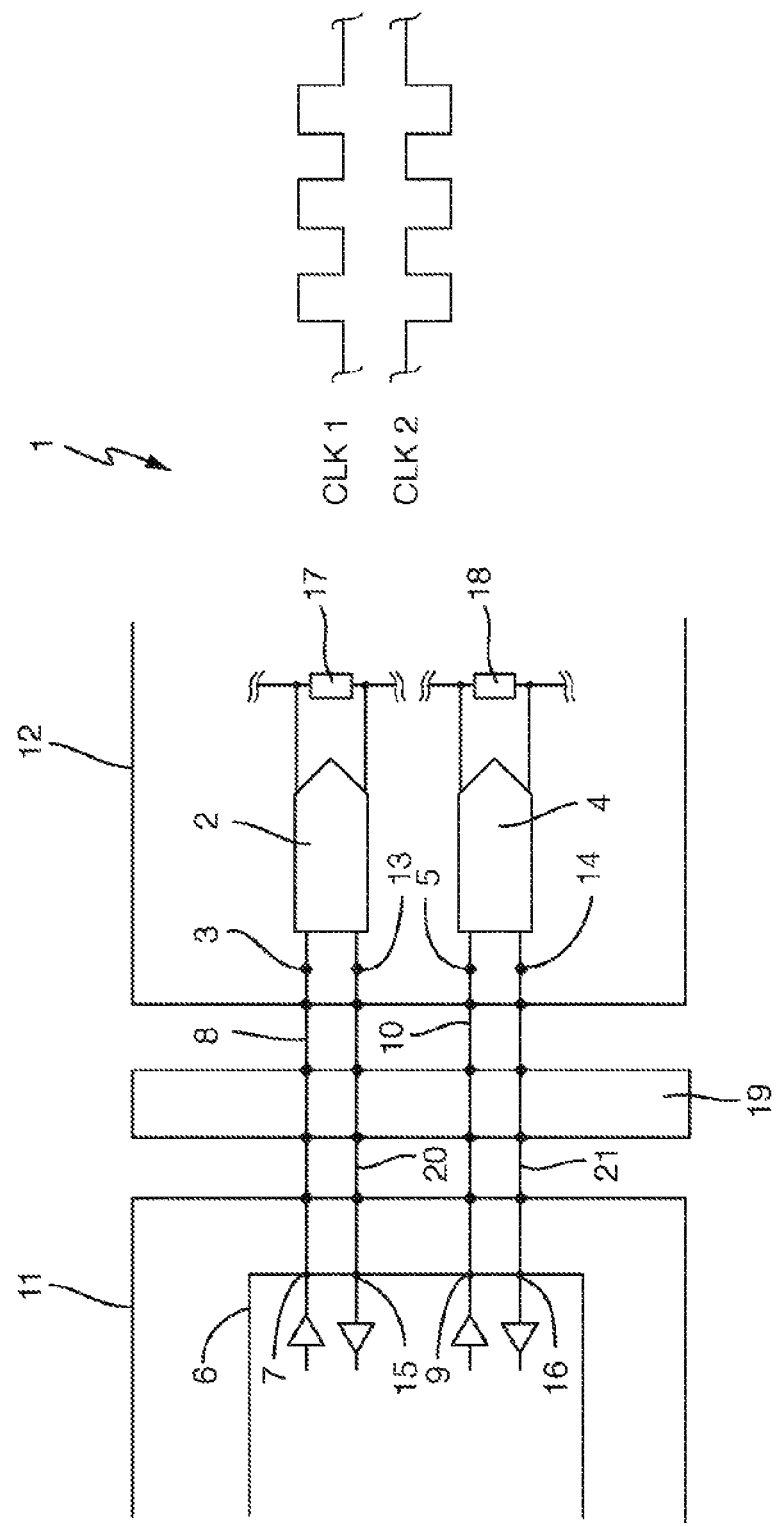

ELECTRIC CONTROL DEVICE

CROSS REFERENCE TO RELATED APPLICATIONS

This application is a national phase of PCT International Application No. PCT/EP2018/068495, filed Jul. 9, 2018, which claims priority under 35 U.S.C. § 119 from German Patent Application No. 10 2017 211 771.0, filed Jul. 10, 2017, the entire disclosures of which are herein expressly incorporated by reference.

BACKGROUND AND SUMMARY OF THE INVENTION

The invention relates to an electric control device.

Rapidly switching signals in electronic assemblies are a source of interference owing to their principle. In order not to exceed interference limit values relating thereto, corresponding measures are necessary to prevent an interference emission above a permissible limit value.

When electric control devices use delta-sigma modulators for example for A/D conversion, a high-frequency clock signal is typically transmitted to a clock input connection of the delta-sigma modulator. The clock signal can be generated in a control electronics system or evaluation unit and can be led via one or more plug connections to a printed circuit board on which the delta-sigma modulator is arranged in order to detect analog signals there. The clock signal typically has a frequency in a range of for instance 10 MHz to 20 MHz. The rise time of an edge of the clock signal should be steep enough to generate as little jitter as possible and not to unnecessarily impair the performance of the conversion. These clock signal properties can lead to undesired interference emissions.

The invention is based on the object of providing an electric control device having delta-sigma modulators and the lowest possible interference emissions.

The invention achieves this object by way of an electric control device having a first delta-sigma modulator having a conventional clock input connection and a second delta-sigma modulator having a conventional clock input connection. Reference should also be made in this respect to the relevant technical literature. It is understood that the electric control device may have more than two delta-sigma modulators, which are then preferably grouped into groups with an even number of delta-sigma modulators.

The electric control device also has an evaluation unit. The evaluation unit has a first clock output connection, which is connected to the clock input connection of the first delta-sigma modulator via a first electrical line, and has a second clock output connection, which is connected to the clock input connection of the second delta-sigma modulator via a second electrical line, which is separate from the first line. The clock output connections serve as a clock source for the delta-sigma modulators.

The evaluation unit generates a clock signal at the first clock output connection with an opposite phase to a clock signal at the second clock output connection.

The generation of the bitstream of the delta-sigma modulators and the transmission of the data or bits from the delta-sigma modulators to the evaluation unit typically takes place in time with the respective clock signals.

Instead of leading the clock signals to each delta-sigma modulator differentially, as is conventional, according to the invention two groups of delta-sigma modulators are formed, which are each supplied with one of two clock signals with an opposite phase to one another. For example, the first group is supplied with the first clock signal and the second group is supplied with the second clock signal. The two clock signals of the groups are offset or form the respective complementary return path of the other clock signal of the group. As a result thereof, the respective interference emissions are offset significantly. The data stream coming from the modulators has a lower clock rate and is offset on average due to the random character thereof.

In one embodiment, the first electrical line and the second electrical line run at least partly in parallel.

In one embodiment, the electric control device further has a first printed circuit board and a second printed circuit board, wherein the evaluation unit is arranged on the first printed circuit board and the first delta-sigma modulator and the second delta-sigma modulator are arranged on the second printed circuit board. The first and the second electrical line in this case run between the two printed circuit boards, in particular in parallel, and are still led, for example, via an electrical connector.

In one embodiment, the evaluation unit has a field-programmable gate array (FPGA) or is an FPGA.

In one embodiment, the first delta-sigma modulator conventionally has a data output connection, the second delta-sigma modulator correspondingly has a data output connection, and the evaluation unit has a first data input connection, wherein the data output connection of the first delta-sigma modulator and/or the data output connection of the second delta-sigma modulator is connected to the first data input connection of the evaluation unit. The evaluation unit can have a second data input connection, wherein the data output connection of the first delta-sigma modulator is connected to the first data input connection of the evaluation unit and the data output connection of the second delta sigma modulator is connected to the second data input connection of the evaluation unit.

In one embodiment, the electric control device is a frequency converter or servo converter. For example, electrical signals, which are necessary for the operation of the frequency converter, can be A/D-converted by means of the delta-sigma modulators.

The transmission of the respective clock signal from the evaluation unit to the delta-sigma modulators and the transmission of the data from the delta-sigma modulators to the evaluation unit takes place in particular non-differentially. In other words, in each case only a single associated line is provided to transmit the respective clock signals and the respective data, wherein a joint line for a reference potential can be provided of course.

Other objects, advantages and novel features of the present invention will become apparent from the following detailed description of one or more preferred embodiments when considered in conjunction with the accompanying drawings.

BRIEF DESCRIPTION OF THE DRAWINGS

FIG. 1 shows an electric control device in accordance with an embodiment of the present invention having a first delta-sigma modulator, a second delta-sigma modulator and an evaluation unit, which generates clock signals for the delta-sigma modulators with an opposite phase to one another.

DETAILED DESCRIPTION OF THE DRAWINGS

FIG. 1 shows an electric control device 1 in the form of a frequency converter having a first delta-sigma modulator 2 having a clock input connection 3, a second delta-sigma modulator 4 having a clock input connection 5, and an evaluation unit 6 in the form of an FPGA. The two delta-sigma modulators 2 and 4 convert voltages present at measurement resistors 17 and 18 in a conventional manner to bit sequences, which are evaluated in the evaluation unit 6. Reference should also be made in this respect to the relevant technical literature.

The evaluation unit 6 or the FPGA has a first clock output connection 7, which is connected to the clock input connection 3 of the first delta-sigma modulator 2 via a first electrical line 8. The evaluation unit 6 or the FPGA correspondingly has a second clock output connection 9, which is connected to the clock input connection 5 of the second delta-sigma modulator 4 via a second electrical line 10.

For the purpose of data transmission, the first delta-sigma modulator 2 has a data output connection 13, the second delta-sigma modulator 4 accordingly has a data output connection 14, and the evaluation unit 6 has a first data input connection 15 and a second data input connection 16, wherein the data output connection 13 of the first delta-sigma modulator 2 is electrically connected to the first data input connection 15 of the evaluation unit 6 via a line 20 and the data output connection 14 of the second delta-sigma modulator 4 is electrically connected to the second data input connection 16 of the evaluation unit 6 via a line 21.

The evaluation unit 6 is designed to generate a clock signal CLK1 at the first clock output connection 7 with a precisely opposite phase (phase-shifted by 180 degrees) to a clock signal CLK2 at the second clock output connection 9.

The electric control device 1 has a first printed circuit board 11 and a second printed circuit board 12, wherein the evaluation unit 6 is arranged on the first printed circuit board 11 and the first delta-sigma modulator 2 and the second delta-sigma modulator 4 are arranged on the second printed circuit board 12.

The first electrical line 8 and the second electrical line 9 run at least partly in parallel on the first printed circuit board 11, via an interface 19, for example in the form of a printed circuit board connector, and on the second printed circuit board 12 between the connections 3 and 7 and 9 and 13 respectively.

The printed circuit board 11, the evaluation unit 6 and further components (not illustrated) can form a control electronics system of the frequency converter 1. The printed circuit board 12 and the components (not illustrated in any more detail) arranged on the printed circuit board 12 can form a power printed circuit board of the frequency converter 1. The clock signals CLK1 and CLK2 are led via the interface 19 to the power printed circuit board 12 in order to detect analog signals there. In this case, the frequency usually lies in a range between for instance 10 MHz to 20 MHz.

It is understood that, in addition to the lines illustrated, a line for a reference potential, for example in the form of a ground potential, can also be present.

The invention provides significant advantages compared to conventional solutions in which a respective clock signal of a delta-sigma modulator is transmitted differentially. For instance, the number of required lines, required pins at plug connectors and required pins at the evaluation unit is halved, since no differential transmission is necessary. This reduces the outlay in conductor track routing.

Compared to solutions in which the clock signal of a respective delta-sigma modulator is transmitted non-differentially and not with an opposite phase, the emitted interference is reduced significantly.

According to the invention, the clock signals CLK1 and CLK2 are transmitted differentially with respect to one another without further pins, lines, etc. needing to be provided for this. This reduces the space requirement compared to a respective differential transmission both of the clock signal CLK1 and of the clock signal CLK2.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. An electric control device, having:
   a first delta-sigma modulator having a clock input connection,
   a second delta-sigma modulator having a clock input connection, and
   an evaluation unit,
   wherein the evaluation unit
      has a first clock output connection connected to the clock input connection of the first delta-sigma modulator via a first electrical line,
      has a second clock output connection connected to the clock input connection of the second delta-sigma modulator via a second electrical line, and
      is configured to generate a clock signal at the first clock output connection with an opposite phase to a clock signal at the second clock output connection.

2. The electric control device according to claim 1, wherein
   the first electrical line and the second electrical line run at least partly in parallel.

3. The electric control device according to claim 2, wherein
   the electric control device has a first printed circuit board and a second printed circuit board, and
   the evaluation unit is arranged on the first printed circuit board and the first delta-sigma modulator and the second delta-sigma modulator are arranged on the second printed circuit board.

4. The electric control device according to claim 3, wherein
   the evaluation unit has an FPGA.

5. The electric control device according to claim 4, wherein
   the first delta-sigma modulator has a first data output connection,
   the second delta-sigma modulator has a second data output connection, and
   the evaluation unit has a first data input connection with at least one of the first data output connection of the first delta-sigma modulator and the second data output connection of the second delta-sigma modulator.

6. The electric control device according to claim 5, wherein
   the evaluation unit has a second data input connection, and
   the first data output connection of the first delta-sigma modulator is connected to the first data input connection of the evaluation unit and the second data output connection of the second delta-sigma modulator is connected to the second data input connection of the evaluation unit.

7. The electric control device according to claim 1, wherein the electric control device is a frequency converter or a servo converter.

* * * * *